United States Patent
Tu et al.

(10) Patent No.: US 7,838,931 B2
(45) Date of Patent: Nov. 23, 2010

(54) HIGH VOLTAGE SEMICONDUCTOR DEVICES WITH SCHOTTKY DIODES

(75) Inventors: Shang-Hui Tu, Tainan (TW);
Hung-Shern Tsai, Tainan County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 12/426,194

(22) Filed: Apr. 17, 2009

(65) Prior Publication Data
US 2010/0148253 A1    Jun. 17, 2010

(30) Foreign Application Priority Data
Dec. 17, 2008   (TW) .............................. 97149114 A

(51) Int. Cl.
*H01L 29/76* (2006.01)
(52) U.S. Cl. ................................ 257/335; 257/E29.026
(58) Field of Classification Search ................. 257/335, 257/296, E29.026, E29.027, E29.066, E29.256, 257/E21.417
See application file for complete search history.

(56) References Cited
U.S. PATENT DOCUMENTS
2007/0246771 A1* 10/2007 McCormack et al. ....... 257/335

* cited by examiner

*Primary Examiner*—Sue Purvis
*Assistant Examiner*—Selim Ahmed

(57) ABSTRACT

High voltage semiconductor devices with Schottky diodes are presented. A high voltage semiconductor device includes an LDMOS device and a Schottky diode device. The LDMOS device includes a semiconductor substrate, a P-body region in a first region of the substrate, and an N-drift region in the second region of the substrate with a junction therebetween. A patterned isolation region defines an active region. An anode electrode is disposed on the P-body region. An N+-doped region is disposed in the N-drift region. A cathode electrode is disposed on the N+-doped region. The Schottky diode includes an N-drift region on the semiconductor substrate. The anode electrode is disposed on the N-drift region at the first region of the substrate. The N+-doped region is disposed on the N-drift region at the second region of the substrate. The cathode electrode is disposed on the N+-doped region.

16 Claims, 3 Drawing Sheets

HIGH VOLTAGE SEMICONDUCTOR DEVICES WITH SCHOTTKY DIODES

CROSS REFERENCE TO RELATED APPLICATIONS

This application is based upon and claims the benefit of priority from a prior Taiwanese Patent Application No. 097149114, filed on Dec. 17, 2008, the entire contents of which are incorporated herein by reference.

BACKGROUND OF THE INVENTION

1. Field of the Invention

The invention relates to high voltage semiconductor devices, and in particular, to high voltage devices integrated with a Schottky diode device.

2. Description of the Related Art

High voltage semiconductor device technologies are applicable to high-voltage and high-power integrated circuit regimes. Specifically, conventional high voltage semiconductor devices are adopted in applications mainly driven by at least 18V. High voltage technologies are advantageous for fulfilling cost benefits and compatible with other semiconductor process. Therefore, high voltage devices are widely applied to display driving IC devices, power supply devices, communication devices, car electronics devices and industrial control devices.

FIG. 1A is a cross section of a conventional N type lateral diffused metal oxide semiconductor (N-LDMOS) device. In FIG. 1A, an N type lateral diffused metal oxide semiconductor device 10 includes a semiconductor substrate 110, and a P-body region 115 formed in a first region 10I of the semiconductor substrate 110. An N-drift region 120a is formed in the second region 10II of the semiconductor substrate 110. An isolation region 135 is disposed on the semiconductor substrate defining an active region. A gate dielectric layer 145 is disposed on the semiconductor substrate with one end extending overlying part of the isolation region 135 and the other end exposing source regions 140a and 140b on the surface of the P-body region, wherein the region 140a is a P type heavily doped region, and the region 140b is an N-type heavily doped region. A polysilicon gate 150 is disposed on the gate dielectric layer 145 with one end extending to overly the isolation region 135. An N+ doped region 130 is formed in the N-drift region 120a and contacted with a second end of the isolation region to serve as a drain region of the N-LDMOS device 10.

In order to achieve a high voltage N-LDMOS device, a lightly doped N-drift region is adopted to serve as a high voltage structure and other techniques such as a reduced surface field (RESURF) method and a field plate method are performed to achieve optimum adaptation of the N-LDMOS devices.

FIG. 1B is a cross section illustrating a conventional Schottky diode device. In FIG. 1B, the conventional Schottky diode device 20 includes a semiconductor substrate 110. A N-drift region 120b is formed in upper portion of the semiconductor substrate. An isolation region 135 is disposed on the semiconductor substrate, thereby defining active device regions including an anode region and a cathode region. A pair of P type doped well 125a and 125b are disposed in the N-drift region 120b corresponding to both sides of the anode region. An inter-layered dielectric (ILD) layer 140 is formed overlying the semiconductor substrate 110 defining an anode contact region and a cathode contact region. A Schottky junction 122 is created between an anode electrode 160a and the N-drift region 120b. An N+ doped region 130 is formed on the N-drift region 120b corresponding to the cathode region and electrically contacted with the cathode electrode 160b.

In order to achieve a high voltage Schottky diode device, a lightly doped N-drift region is typically adopted to serve as a high voltage structure. When the N-LDMOS device and the Schottky diode device are integrated with an integrated circuit, however, the same concentrated doped N-drift regions 120a and 120b are not suitable for the N-LDMOS device and the Schottky diode device, respectively. In this regard, different concentrated doped N-drift regions must be respectively formed in the N-LDMOS device and the Schottky diode device, resulting in demand for additional photo-masks during fabrication, thus leading to higher fabrication costs.

BRIEF SUMMARY OF THE INVENTION

An embodiment of the invention provides a high voltage semiconductor device integrated with a Schottky diode, comprising: a first device and a second device. The first device comprises: a semiconductor substrate; a first type doped-body region in a first region of the semiconductor substrate; a second type doped-drift region in the second region of the semiconductor substrate with a junction between the second type doped-drift region and the first type doped-body region; an isolation region disposed on the semiconductor substrate defining an active region; a dielectric layer disposed on the semiconductor substrate with one end extending overlying part of the isolation region and the other end exposing a portion of the first type doped-body region; a first electrode disposed on the exposed portion of the first type doped-body region; a second type heavily doped region disposed in the second type doped-drift region and contacted with a second end of the isolation region; a second electrode disposed on the second type heavily doped region; and a third electrode disposed on the dielectric layer. The second device comprises: a second type doped-drift region formed in the first region and a second region of the semiconductor substrate; a first electrode disposed on the second type doped-drift region in the first region of the semiconductor substrate; a second type heavily doped region formed in the second type doped-drift region in the second region of the semiconductor substrate; and a second electrode disposed on the second type heavily doped region.

Another embodiment of the invention provides a high voltage semiconductor device integrated with a Schottky diode, comprising: a lateral diffused metal oxide semiconductor (LDMOS) device and a Schottky diode device. The LDMOS device comprises: a semiconductor substrate; a P-body region in a first region of the semiconductor substrate; an N-drift region in the second region of the semiconductor substrate with a junction between the N-drift region and the P-body region; an isolation region disposed on the semiconductor substrate defining an active region; a dielectric layer disposed on the semiconductor substrate with one end extending overlying part of the isolation region and the other end exposing a portion of the P-body region; an anode electrode disposed on the exposed portion of the P-body region; an N+ doped region disposed in the N-drift region and contacted with a second end of the isolation region; a cathode electrode disposed on the N+ doped region; and a gate electrode disposed on the dielectric layer. The Schottky diode device comprises: an N-drift region formed in the first region and a second region of the semiconductor substrate; an anode electrode disposed on the N-drift region in the first region of the semiconductor substrate; an N+ doped region formed in the N-drift region in the second region of the semiconductor substrate; and a cathode electrode disposed on the N+ doped region.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1A:
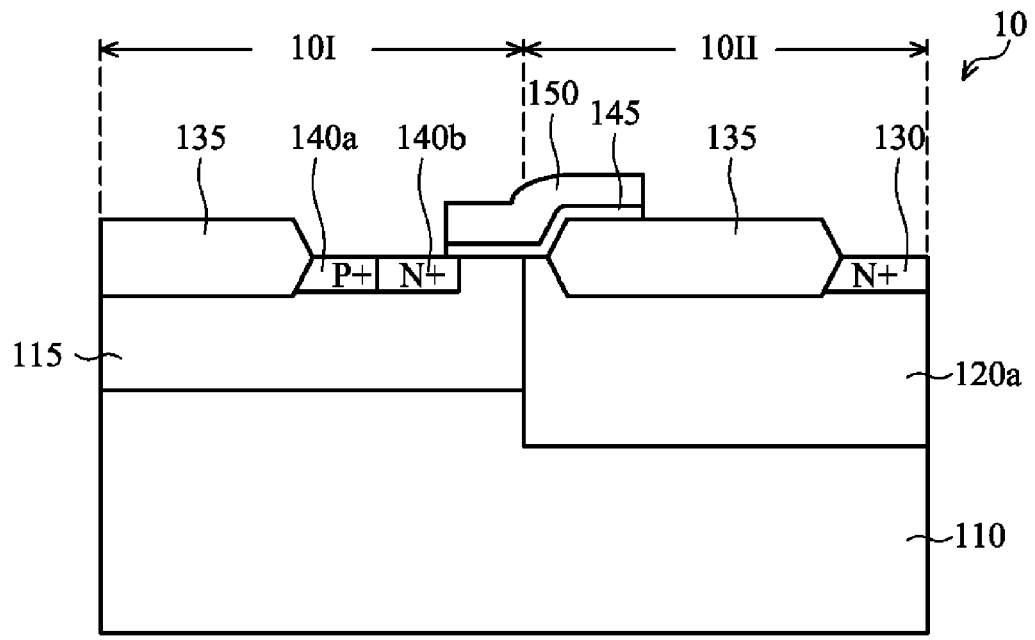
FIG. 1A is a cross section of a conventional N type lateral diffused metal oxide semiconductor (N-LDMOS) device.
Figure 1B:
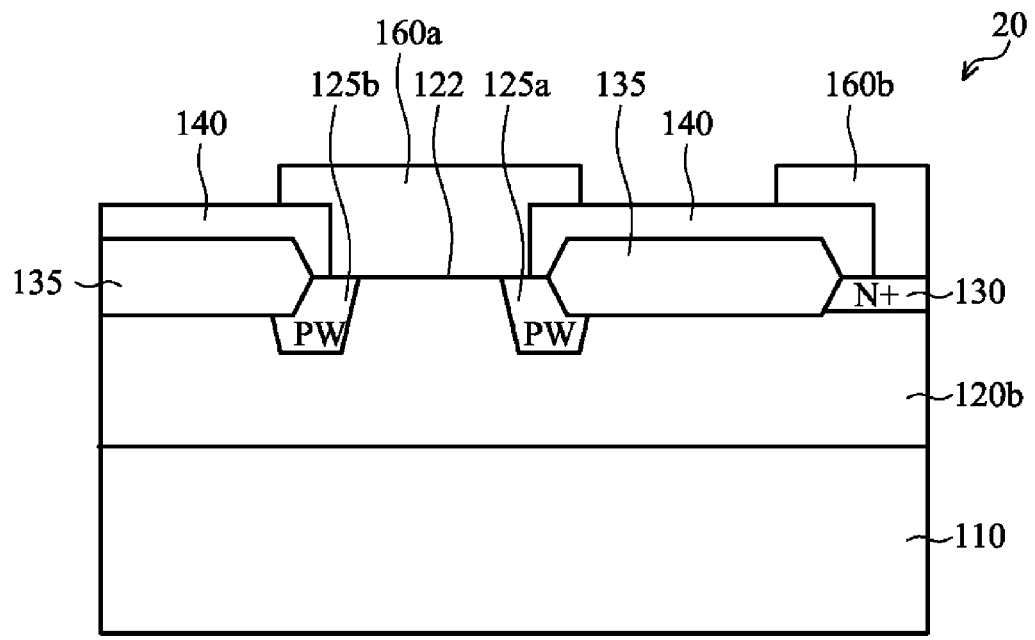
FIG. 1B is a cross section illustrating a conventional Schottky diode device.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself indicate a relationship between the various embodiments and/or configurations discussed. Moreover, the formation of a first feature over or on a second feature in the description that follows may include embodiments in which the first and second features are formed in direct contact or not in direct contact.

Embodiments of the invention provide a high voltage semiconductor device integrated with a Schottky diode device. An N-LDMOS device structure is adapted as a base structure. A Schottky diode device is integrated with the N-LDMOS device to achieve the same level of high voltage as the N-LDMOS device.

Figure 2A:
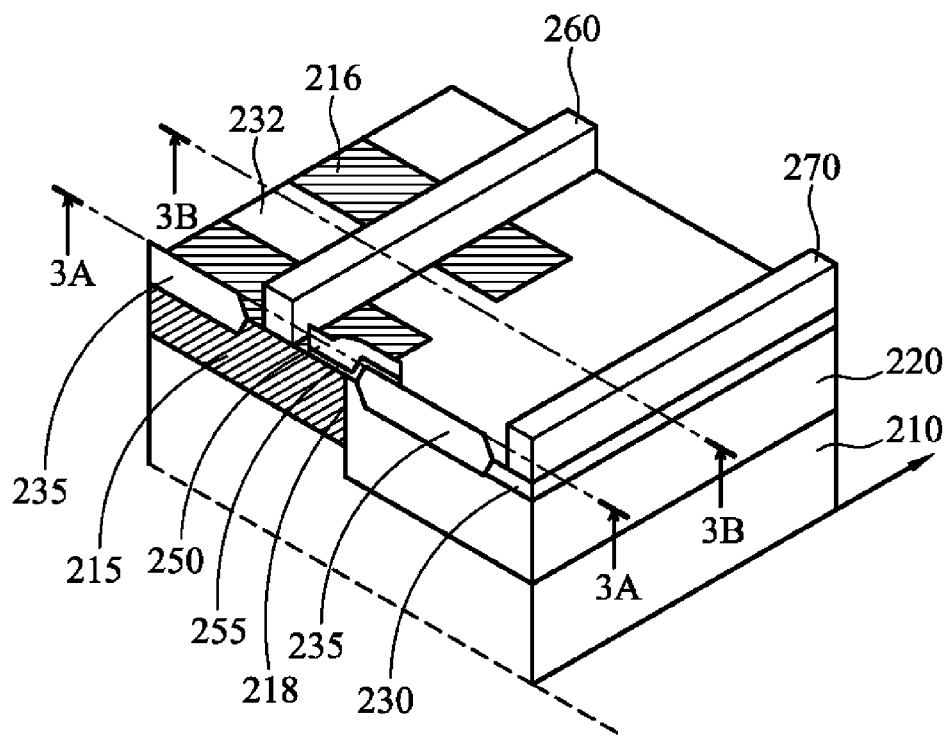
FIG. 2A is a perspective view schematically showing an embodiment of a high voltage semiconductor device integrated with a Schottky diode device of the invention.

FIG. 2A is a perspective view schematically showing an embodiment of a high voltage semiconductor device integrated with a Schottky diode device of the invention. Referring to FIG. 2A, a high voltage semiconductor device integrated with a Schottky diode includes a lateral diffused metal oxide semiconductor (LDMOS) device 200a and a Schottky diode device 200b, the cross sections of which are respectively shown in FIGS. 3A and 3B. The LDMOS device includes a semiconductor substrate 210 such as P type doped semiconductor substrate. Further, the semiconductor substrate 210 can include a single crystalline semiconductor substrate, an epitaxial semiconductor substrate, and a silicon-on-insulator (SOI) substrate. A P-body region 215 is formed in a first region 2001 of the semiconductor substrate. An N-drift region 220 is formed in the second region 20011 of the semiconductor substrate with a junction 218 between the N-drift region 220 and the P-body region 215. An isolation region 235 is disposed on the semiconductor substrate defining an active device region. A gate dielectric layer 255 is disposed on the semiconductor substrate with one end extending overlying part of the isolation region and the other end exposing a portion of the P-body region 215. A polysilicon gate electrode 250 is disposed on the dielectric layer. An anode electrode 260 is disposed on the exposed portion of the P-body region. An N+ doped region 230 is disposed in the N-drift region 220 and contacted with a second end of the isolation region 235. A cathode electrode 270 is disposed on the N+ doped region.

The abovementioned Schottky diode device 200b comprises an N-drift region 220 formed in the first region 2001 and a second region 20011 of the semiconductor substrate 210. The insulation region 235 is disposed on the semiconductor substrate 210, defining an anode region and a cathode region of the Schottky diode. An anode electrode 260 is disposed on the first region 2001 of the semiconductor substrate such that a Schottky junction 233 is created between the anode electrode 260 and the N-drift region 220 in the LDMOS device. An N+ doped region 230 is formed in the N-drift region 220 corresponding to the cathode region of the Schottky diode device and a cathode electrode 270 is disposed on the N+ doped region 230. Note that according to an embodiment of the invention the LDMOS device 200a and the Schottky diode device 200b are neighboring along a longitudinal axis of the anode electrode 260.

Figure 2B:
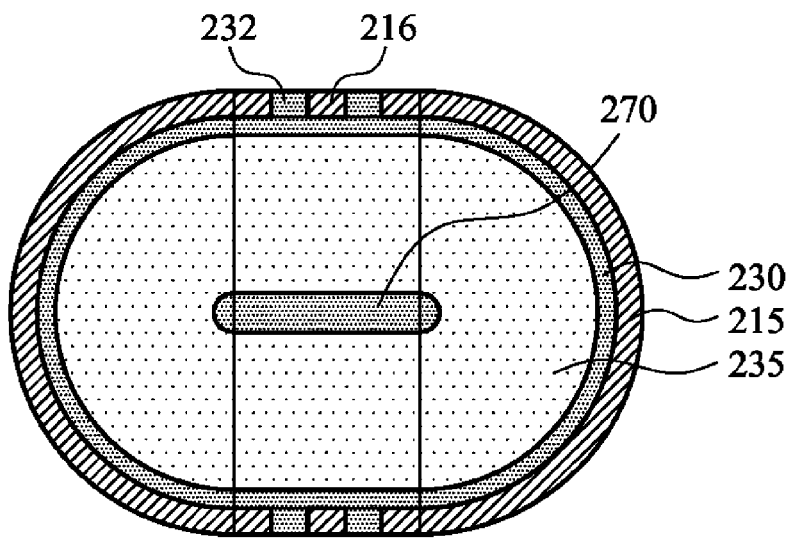
FIG. 2B is a plan view of the high voltage semiconductor device integrated with a Schottky diode device of FIG. 2A.

FIG. 2B is a plan view of the high voltage semiconductor device integrated with a Schottky diode device of FIG. 2A. Referring to FIG. 2B, the P-body region 215 is a ring shape doped region, however the invention is not limited thereto, and at the central region of the ring shape doped region, the isolation region 235 defines the N+ doped region 230 which is disposed under the cathode electrode 270. In one embodiment of the invention, the ring shape doped region 215 has two opening regions 232 with a P-body doped region 216 interposed therebetween. Note that, in FIGS. 2A and 2B, the dimensions of the P-body doped region 216 and the opening regions 232 can be adapted according to realistic designs of apparatuses to optimize operating performance thereof.

Figure 3A:
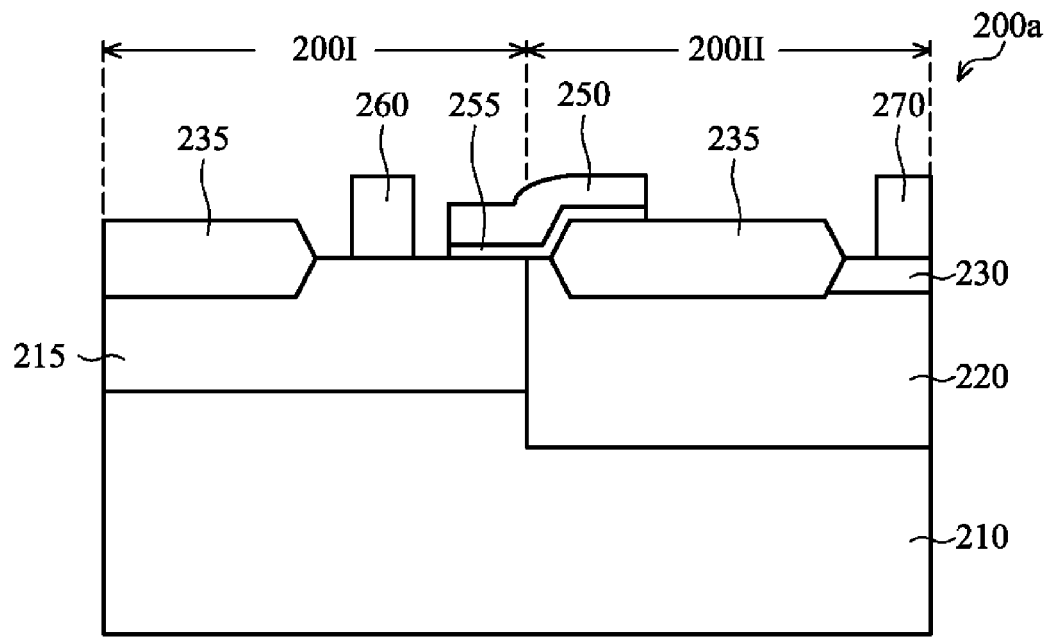
FIGS. 3A and 3B are cross sections respectively illustrating the high voltage semiconductor device integrated with a Schottky diode device of FIG. 2A taken along lines 3A-3A and 3B-3B.
Figure 3B:
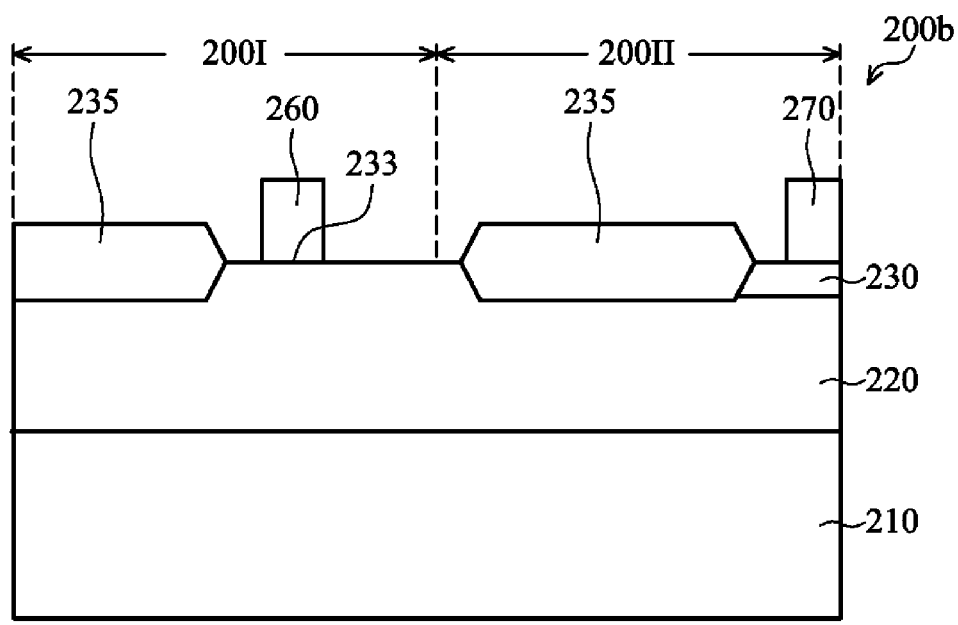

FIGS. 3A and 3B are cross sections respectively illustrating the high voltage semiconductor device integrated with a Schottky diode device of FIG. 2A taken along lines 3A-3A and 3B-3B. Referring to FIG. 3A, embodiments of the invention are mainly based on the N type LDMOS device eliminating the N-type and P-type heavily doped regions on the conventional source end. A Schottky metal is designed and disposed on the P-body doped region. The polysilicon gate electrode is extended and connected to the anode electrode to implement high-voltage capability. Meanwhile, referring to FIG. 3B, based on the structure of the first device, the P-body doped region is replaced by the N-drift region without disposing the polysilicon gate electrode, to provide a forward bias current.

Upon operation, the high voltage semiconductor device integrated with a Schottky diode device can be operated under a forward bias and a reversed bias operation. Under a forward bias operation, the Schottky junction 233 between the anode electrode (or referred as a Schottky metal) and the N-drift region 220 of the Schottky diode device 200b provides current, and under a reversed bias operation, a completed depletion region is formed at a junction 218 between the N-drift region 220 and the P-body region 215 of the LDMOS device 200a to improve high-voltage endurance.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high voltage semiconductor device integrated with a Schottky diode, comprising:
   a first device comprising:
      a semiconductor substrate;
      a first type doped-body region in a first region of the semiconductor substrate;
      a second type doped-drift region in a second region of the semiconductor substrate with a junction between the second type doped-drift region and the first type doped-body region;
      an isolation region disposed on the semiconductor substrate defining an active region;
      a dielectric layer disposed on the semiconductor substrate with one end extending overlying part of the isolation region and the other end exposing a portion of the first type doped-body region;
      a first electrode disposed on the exposed portion of the first type doped-body region;
      a second type heavily doped region disposed in the second type doped-drift region and contacted with a second end of the isolation region;
      a second electrode disposed on the second type heavily doped region; and
      a third electrode disposed on the dielectric layer; and
   a second device comprising:
      a second type doped-drift region formed in a third region and a fourth region of the semiconductor substrate;
      a first electrode disposed on the second type doped-drift region in the third region of the semiconductor substrate;
      a second type heavily doped region formed in the second type doped-drift region in the fourth region of the semiconductor substrate; and
      a second electrode disposed on the second type heavily doped region,
   wherein the first type doped-body region is a ring shape doped region, and at the central region of the ring shape doped region, the isolation region defines the second type heavily doped region, wherein the ring shape doped region has two openings of the second type doped-drift regions.

2. The high voltage semiconductor device as claimed in claim 1, wherein the semiconductor substrate comprises a single crystalline semiconductor substrate, an epitaxial semiconductor substrate, and a silicon-on-insulator (SOI) substrate.

3. The high voltage semiconductor device as claimed in claim 1, wherein the first device and the second device are neighboring along a longitudinal axis of the first electrode.

4. The high voltage semiconductor device as claimed in claim 1, wherein the first type doped-body region is a P-body region and the second type doped-drift region is an N-drift region.

5. The high voltage semiconductor device as claimed in claim 1, wherein the first electrode and the third electrode are electrically contacted.

6. The high voltage semiconductor device as claimed in claim 1, wherein the first device is a lateral diffused metal oxide semiconductor (LDMOS) device, and the second device is a Schottky diode.

7. The high voltage semiconductor device as claimed in claim 1, wherein the first electrode is an anode electrode and the second electrode is a cathode electrode.

8. The high voltage semiconductor device as claimed in claim 1, wherein in the second device, a Schottky junction exists between the first electrode and the second type doped-drift region.

9. The high voltage semiconductor device as claimed in claim 8, wherein under a forward bias operation, the Schottky junction between the first electrode and the second type doped-drift region provides current, and under a reversed bias operation, a completed depletion region is formed at a junction between the second type doped-drift region and the first type doped-body region of the first device to endure high voltage.

10. A high voltage semiconductor device integrated with a Schottky diode, comprising:
    a lateral diffused metal oxide semiconductor (LDMOS) device comprising:
       a semiconductor substrate;
       a P-body region in a first region of the semiconductor substrate;
       an N-drift region in a second region of the semiconductor substrate with a junction between the N-drift region and the P-body region;
       an isolation region disposed on the semiconductor substrate defining an active region;
       a dielectric layer disposed on the semiconductor substrate with one end extending overlying part of the isolation region and the other end exposing a portion of the P-body region;
       an anode electrode disposed on the exposed portion of the P-body region;
       an N+ doped region disposed in the N-drift region and contacted with a second end of the isolation region;
       a cathode electrode disposed on the N+ doped region; and
       a gate electrode disposed on the dielectric layer; and
    a Schottky diode device comprising:
       an N-drift region formed in a third region and a fourth region of the semiconductor substrate;
       an anode electrode disposed on the N-drift region in the third region of the semiconductor substrate;
       an $N^+$ doped region formed in the N-drift region in the fourth region of the semiconductor substrate; and
       a cathode electrode disposed on the $N^+$ doped region,
    wherein the P-body region is a ring shape doped region, and at the central region of the ring shape doped region, the isolation region defines the N+ doped region, wherein the ring shape doped region has two openings of the N-drift regions.

11. The high voltage semiconductor device as claimed in claim 10, wherein the semiconductor substrate comprises a single crystalline semiconductor substrate, an epitaxial semiconductor substrate, and a silicon-on-insulator (SOI) substrate.

12. The high voltage semiconductor device as claimed in claim 10, wherein the LDMOS device and the Schottky diode device are neighboring along a longitudinal axis of the anode electrode.

13. The high voltage semiconductor device as claimed in claim 10, wherein the anode electrode and the gate electrode are electrically contacted.

14. The high voltage semiconductor device as claimed in claim 10, wherein the anode electrode comprises a metal.

15. The high voltage semiconductor device as claimed in claim 10, wherein in the Schottky diode device, a Schottky junction exists between the anode electrode and the N-drift region.

16. The high voltage semiconductor device as claimed in claim 15, wherein under a forward bias operation, the Schottky junction between the anode electrode and the N-drift region provides current, and under a reversed bias operation, a complete depletion region is formed at a junction between the N-drift region and the P-body region of the LDMOS device to endure high voltage.

* * * * *